(12) United States Patent
Valvo et al.

(10) Patent No.: US 7,847,360 B2
(45) Date of Patent: Dec. 7, 2010

(54) RADIATION DETECTOR OF THE DELTAE-E TYPE WITH INSULATION TRENCHES

(75) Inventors: Giuseppina Valvo, Noto (IT); Piero Giorgio Fallica, Catania (IT); Stefano Agosteo, Milan (IT); Alberto Fazzi, Milan (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 809 days.

(21) Appl. No.: 11/810,701

(22) Filed: Jun. 5, 2007

(65) Prior Publication Data

US 2008/0121807 A1 May 29, 2008

(30) Foreign Application Priority Data

Jun. 5, 2006  (EP) .................................. 06114962

(51) Int. Cl.
  *H01L 31/0352* (2006.01)
(52) U.S. Cl. ............................... 257/429; 257/E31.035; 250/370.02
(58) Field of Classification Search ................. 257/429, 257/430, E27.004, E31.035; 250/370.02, 250/370.05, 370.06, 370.07
See application file for complete search history.

(56) References Cited

U.S. PATENT DOCUMENTS 5,854,506 A    12/1998    Fallica

FOREIGN PATENT DOCUMENTS

| EP | 1 061 587 A | 12/2000 |
|---|---|---|
| EP | 0 730 304 B1 | 10/2001 |
| EP | 1 258 927 A1 | 11/2002 |
| EP | 1 453 100 A | 9/2004 |
| WO | WO 2005/098956 A | 10/2005 |
| WO | WO 2005/098956 A1 * | 10/2005 |

OTHER PUBLICATIONS

European Search Report for EP 06 11 4962 dated Nov. 16, 2006.

* cited by examiner

*Primary Examiner*—W. David Coleman
*Assistant Examiner*—Daniel Shook
(74) *Attorney, Agent, or Firm*—Lisa K. Jorgenson; Kevin D. Jablonski; Graybeal Jackson LLP

(57) ABSTRACT

A radiation detector of the ΔE-E type is proposed. The detector is integrated in a chip of semiconductor material with a front surface and a back surface opposite the front surface, the detector having at least one detection cell arranged on the front surface for receiving a radiation to be evaluated, wherein the detector includes: a first region of a first type of conductivity extending into the chip from the front surface to a first depth; a second region of a second type of conductivity extending into the chip from the back surface to a second depth so as to reach the first region; and for each detection cell a third region of the second type of conductivity extending into the first region from the front surface to a third depth lower than the first depth and the second depth, a thin sensitive volume for absorbing energy from the radiation being defined by a junction between the first region and each third region, and a thick sensitive volume for absorbing further energy from the radiation being defined by a further junction between the first region and the second region. For each detection cell the detector further includes insulation means arranged around the third region and extending from the front surface into the first region to an insulation depth comprised between the first depth and the third depth.

19 Claims, 7 Drawing Sheets

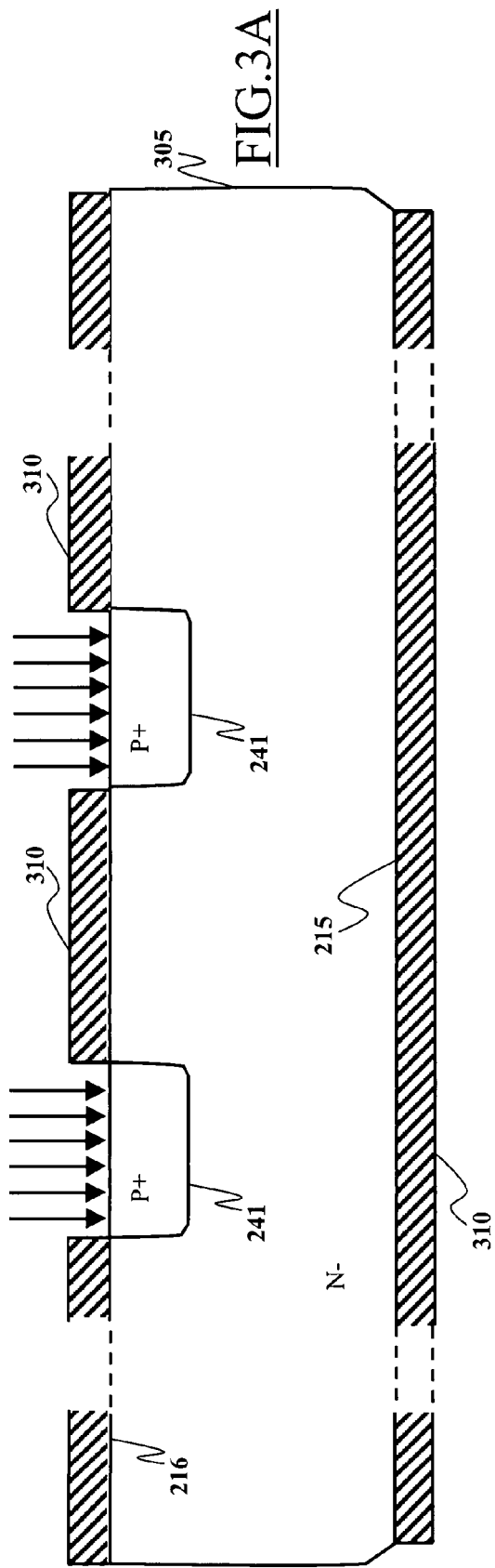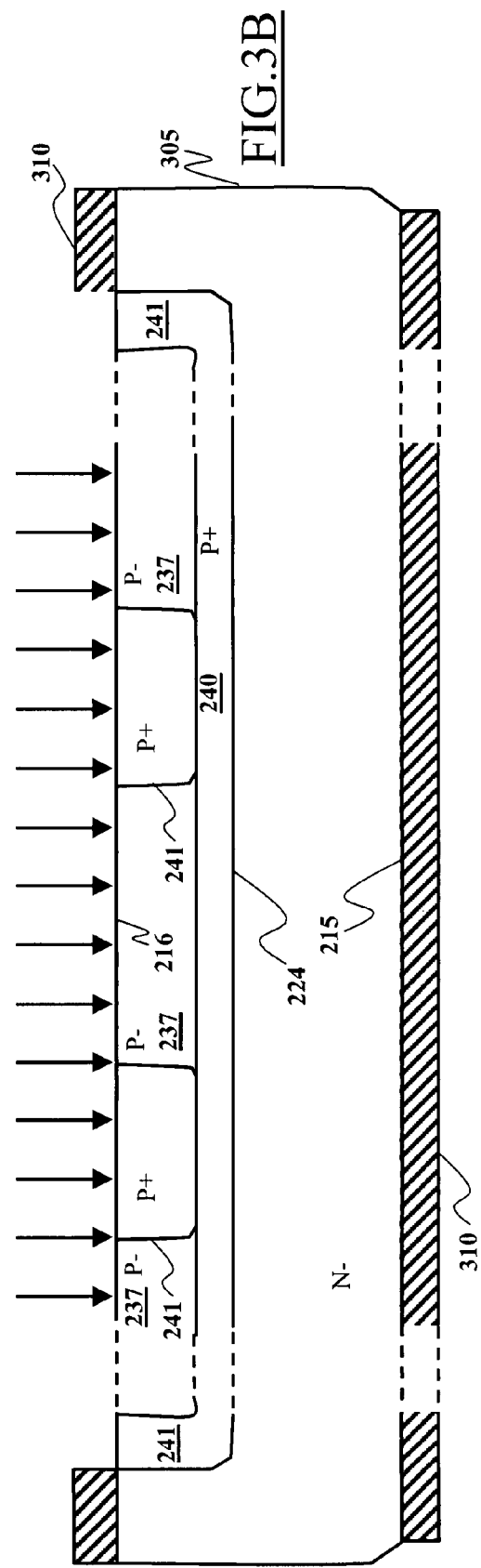

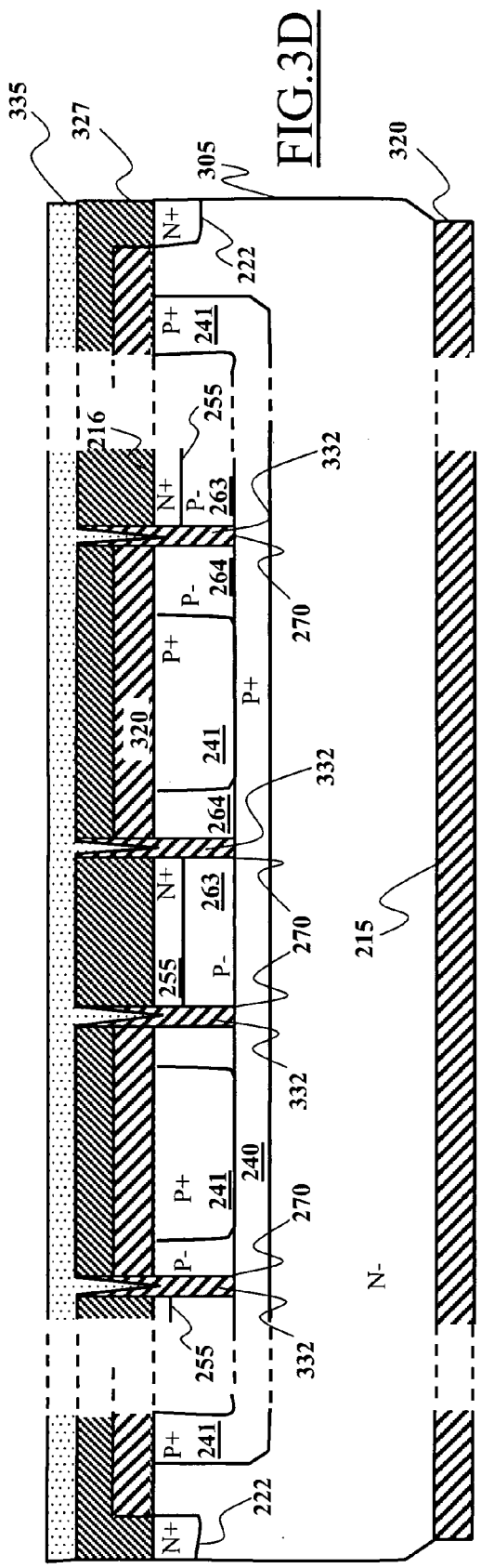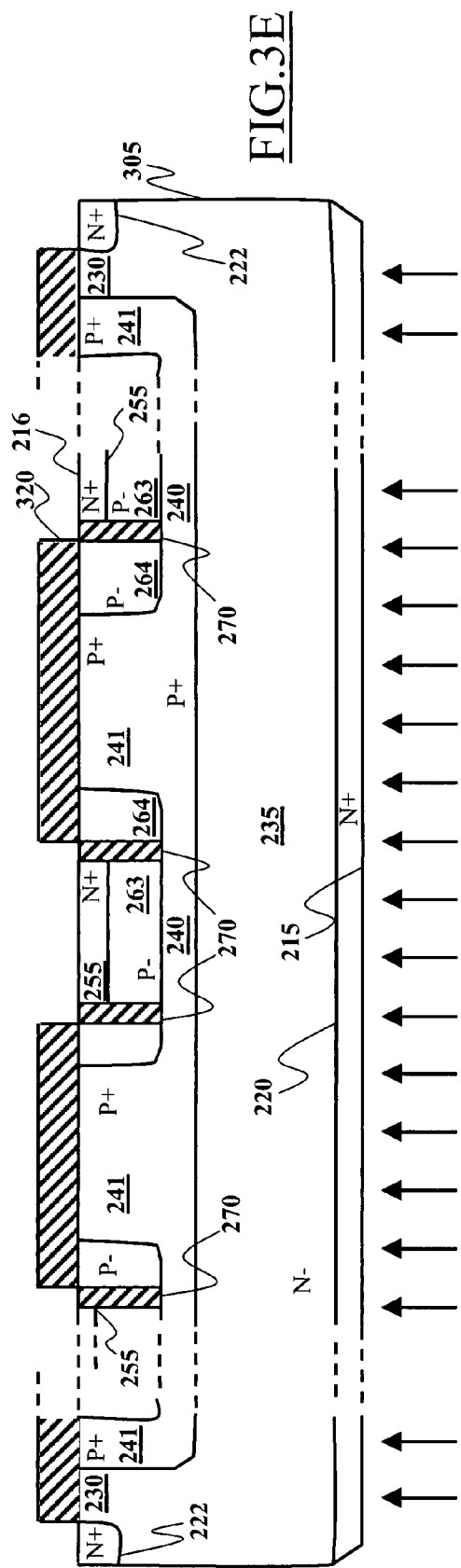

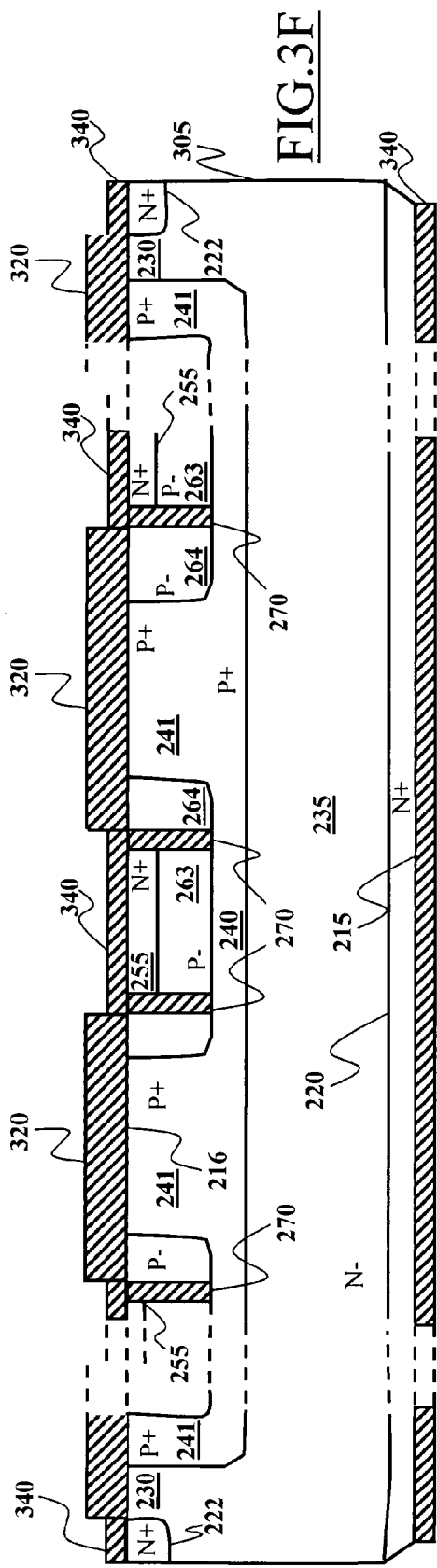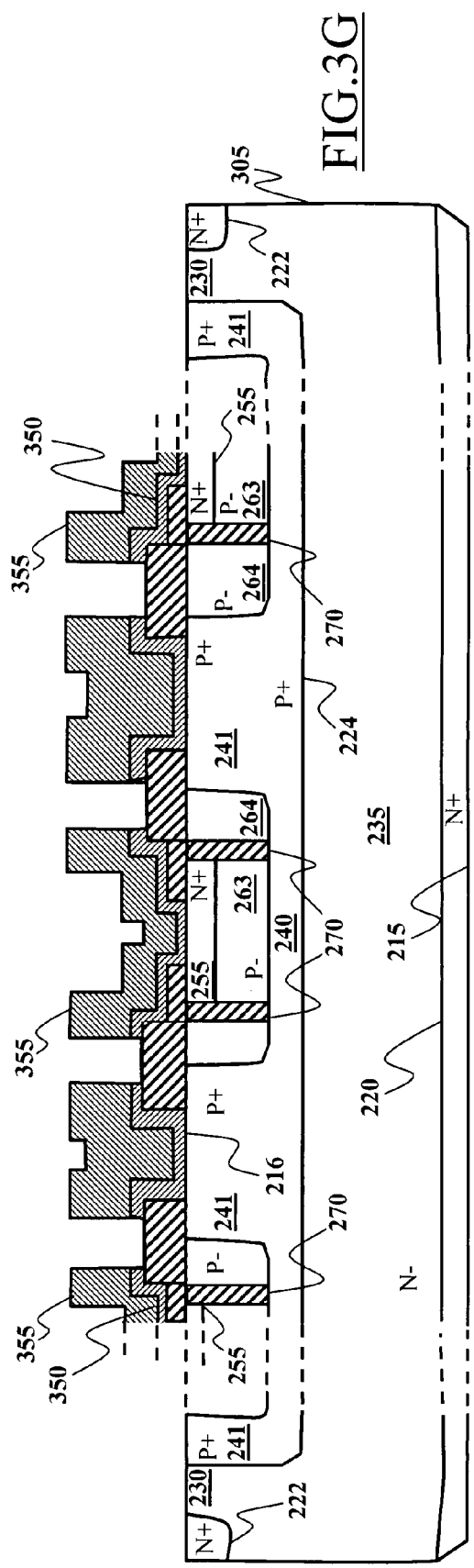

RADIATION DETECTOR OF THE DELTAE-E TYPE WITH INSULATION TRENCHES

PRIORITY CLAIM

This application claims priority from European patent application No. EP06114962.1, filed Jun. 5, 2006, which is incorporated herein by reference.

TECHNICAL FIELD

An embodiment of the present invention relates to the microdosimetry field. More specifically, the present invention relates to radiation detectors of the ΔE-E type.

BACKGROUND

Microdosimetry is a branch of radiological physics that provides a quantitative characterization on micrometric scale of the spatial and temporal distribution of the energy deposition in matter exposed to ionizing radiation. For example, the microdosimetry may provide an indication of the action of the radiation on biological matter (molecules, cells, tissues, and whole organisms, including humans) related to the energy absorbed in subcellular volumes.

Typical applications of the microdosimetry include radiobiology (which seeks to discover the molecular changes responsive to radiation, such as cancer induction, genetic mutations, and cell death), radiation protection (i.e. protection against harmful effects of radiation), and radiotherapy (which is the use of high-energy radiation—from x-rays, gamma rays, neutrons, and other sources—to kill cancer cells and shrink tumors). Moreover, the microdosimetry may also be applied in the study of the effects of radiation on electronic devices.

A microdosimeter typically includes a radiation detector and a measuring system, which is adapted to evaluate a response of the radiation detector to obtain information about the incident radiation. Typically, in the above-mentioned applications to biological matter, the detector is covered by a layer made of a tissue-equivalent material; the tissue-equivalent layer is designed to mimic the response of biological tissue, i.e. to absorb and scatter radiation to the same degree, so as to simulate a radiation field generated under an equivalent biologic tissue when struck by radiation.

As a result, the energy deposited in the detector is related to the so-called linear energy transfer (LET) in tissue. The LET of a charged particle (ion) traversing a microscopic volume is approximated by the quantity lineal energy, i.e. the quotient of the energy deposited in the volume and the mean chord length of the volume. This relation to LET enables microdosimetry to distinguish between recoil electrons, protons, alpha particles and heavy ions. This, in turn, enables the determination of neutron and gamma ray absorbed doses, quality factors, and dose equivalents.

A first experimental detector has been the Tissue-equivalent Proportional Counter (TEPC), which uses a low-pressure gas (with an atomic composition similar to that of biological tissue) to fill a cavity roughly of some centimeters in diameter. The cavity lies at the center of a sphere of conducting plastic (also with an atomic composition similar to that of biological tissue). The TEPC "samples" a particle's track, so that the energy deposited in the gas is related to the LET of the particle. The TEPC presents some disadvantages, such as the impossibility of producing detectors of small sizes that can be easily located in an anthropomorphous puppet or in-vivo on a patient, and the impossibility of observing physical phenomena directly at micrometric sizes without simulating them acting on the gas pressure.

Detectors of the semiconductor type have also been proposed; the semiconductor detectors are stable, linear in their energy response to all types of particles, and can be made small and very thin (less than 0.01 mm). Typically, a semiconductor detector provides a sensitive volume (wherein energy is collected) restricted to the depletion zone around a PN junction. When a particle reaches the depletion zone, it causes the formation of electron-hole pairs and, then, it deposes energy. The depletion zone ensures a minimal recombination of electron-hole pairs and, accordingly, the amount of recombination of charge can be related to the LET of the particle with a high degree of accuracy.

Tests of microdosimetry feasibility have been performed on different semiconductor detectors. The test results agree with the theoretical expectations, but they have also pointed out the influence of the electronic noise, which limits a minimum LET to be detected, and of a so-called field-funneling effect.

The field-funneling effect consists of a transient local distortion of the electric field in the depletion zone, which occurs when a particle's track intercepts a PN junction. The equipotential lines are stretched in the shape of a funnel along the track, and the excess charges produced by the track inside this funneling region are collected very rapidly (typically within a fraction of a nanosecond), which results in a return of the electric field to the steady-state condition. The field-funneling effect is induced by high-LET particles, leading to the collection of electron-hole pairs produced in a non-depleted zone. Accordingly, this effect causes an undesired dependence of the sensitive volume thickness on the particle LET.

For example, let us consider a commercial photodiode Hamamatsu S3590-06, not biased, having a depletion zone of 20 μm and an effective area of about 1 cm$^2$. Test results show that the field-funneling effect has brought the sensitive volume to even double the thickness (40 μm).

It has been also realized a microdosimeter with an ASIC (Application Specific Integrated Circuit) in BiCMOC 0.8 μm technology, including a matrix of PN diodes, each one having a sensitive area of 1 mm$^2$ and a depletion zone of about 2 μm. The electronic noise, measured on the microdosimeter with its measure system, has limited the detectable LET to 10 keV·μm$^{-1}$. In addition, the field-funneling effect has brought the sensitive volume thickness to about 12 μm.

U.S. Pat. No. 5,854,506 (the entire disclosure of which is incorporated herein by reference) discloses a semiconductor detector of the so-called ΔE-E type. This ΔE-E detector includes a detection cell having a vertical structure consisting of a thick diode (with a thickness of about some hundreds of μm) and a thin diode (with a thickness of about some μm). The two diodes are integrated in a same chip of semiconductor material and have a common anode buried in the chip, a front cathode and a back cathode.

In operation, the two diodes are reverse biased in total depletion conditions. When the detector is irradiated, a particle interacts firstly with the thin diode, losing only a small first part of its energy (ΔE), and then with the thick diode, to which it yields a greater second part of its energy, up to all the residual one (E-ΔE). Accordingly, the detection cell includes two distinct sensitive volumes, a ΔE region and an E region, separated by the common buried anode having a heavily doping concentration; the clear separation between the two regions provides an effective limitation of the field-funneling effect, with the excess charges that are collected into the E region.

A ΔE-E detector for microdosimetric applications typically has a modular structure with a matrix of detection cells; each detection cell has a sensitive volume comparable with the biological cell size, in order to improve the detection efficiency.

However, such a detector shows a high capacitance and, accordingly, a significant electronic noise. Then, the microdosimetric requirement of a detectable LET lower than 10 keV·µm$^{-1}$ imposes very high performance in terms of noise to circuits coupled to the detector.

Furthermore, the sensitive volume of each detection cell is increased to include a region surrounding each detecting cell; this drawback is particular acute in microdosimetric applications, wherein it is very important to keep the sensitive volume comparable with the biological cell size.

SUMMARY

An embodiment of the present invention proposes a solution, which is based on the idea of insulating the sensitive volume of each detection cell of the ΔE-E detector.

More specifically, an embodiment of the present invention provides a radiation detector of the ΔE-E type; the detector is integrated in a chip of semiconductor material (with a front surface and a back surface, opposite the front surface). The detector has one or more detection cells arranged on the front surface (for receiving a radiation to be evaluated). The detector includes a first region (anode) of a first type of conductivity extending into the chip from the front surface to a first depth. A second region (cathode) of a second type of conductivity extends into the chip from the back surface to a second depth, so as to reach the first region. For each detection cell a third region (cathode) of the second type of conductivity extends into the first region from the front surface to a third depth (lower than the first depth and the second depth). A thin sensitive volume (for absorbing energy from the radiation) is then defined by a junction between the first region and each third region; a thick sensitive volume (for absorbing further energy from the radiation) is defined by a further junction between the first region and the second region. For each detection cell the detector further includes insulation means (such as a trench) arranged around the third region; this insulation means extends from the front surface into the first region to an insulation depth comprised between the first depth and the third depth.

The detector may have two active regions having a lower doping concentration (with respect to distinct contact regions).

For example, this result is achieved by providing lightly doped fourth regions extending into the first region from the front surface, wherein each third region is formed (with the insulation means that extends substantially to the same depth as the corresponding fourth region for insulating the active region from its remaining part).

In this way, in each forth region a buried contact region (accessed through a sinker region) is obtained.

In an embodiment of the present invention, the desired result is achieved by means of a trench that is filled with an insulating material.

Each detection cell may have a circular section.

In an embodiment of the present invention the detector includes a plurality of detection cells, which are electrically connected together.

The detector may further include a channel-stopper region arranged around the detection cells.

A further embodiment of the present invention provides a solid-state microdosimeter including this radiation detector.

A still further embodiment of the invention provides a corresponding process for integrating the radiation detector in a chip of semiconductor material.

BRIEF DESCRIPTION OF THE DRAWINGS

One or more embodiments of the invention, however, as well as features and the advantages thereof will be best understood by reference to the following detailed description, given purely by way of a non-restrictive indication, to be read in conjunction with the accompanying drawings.

In this respect, it is expressly intended that the figures are not necessary drawn to scale and that, unless otherwise indicated, they are merely intended to conceptually illustrate the structures and procedures described herein.

Figure 1:
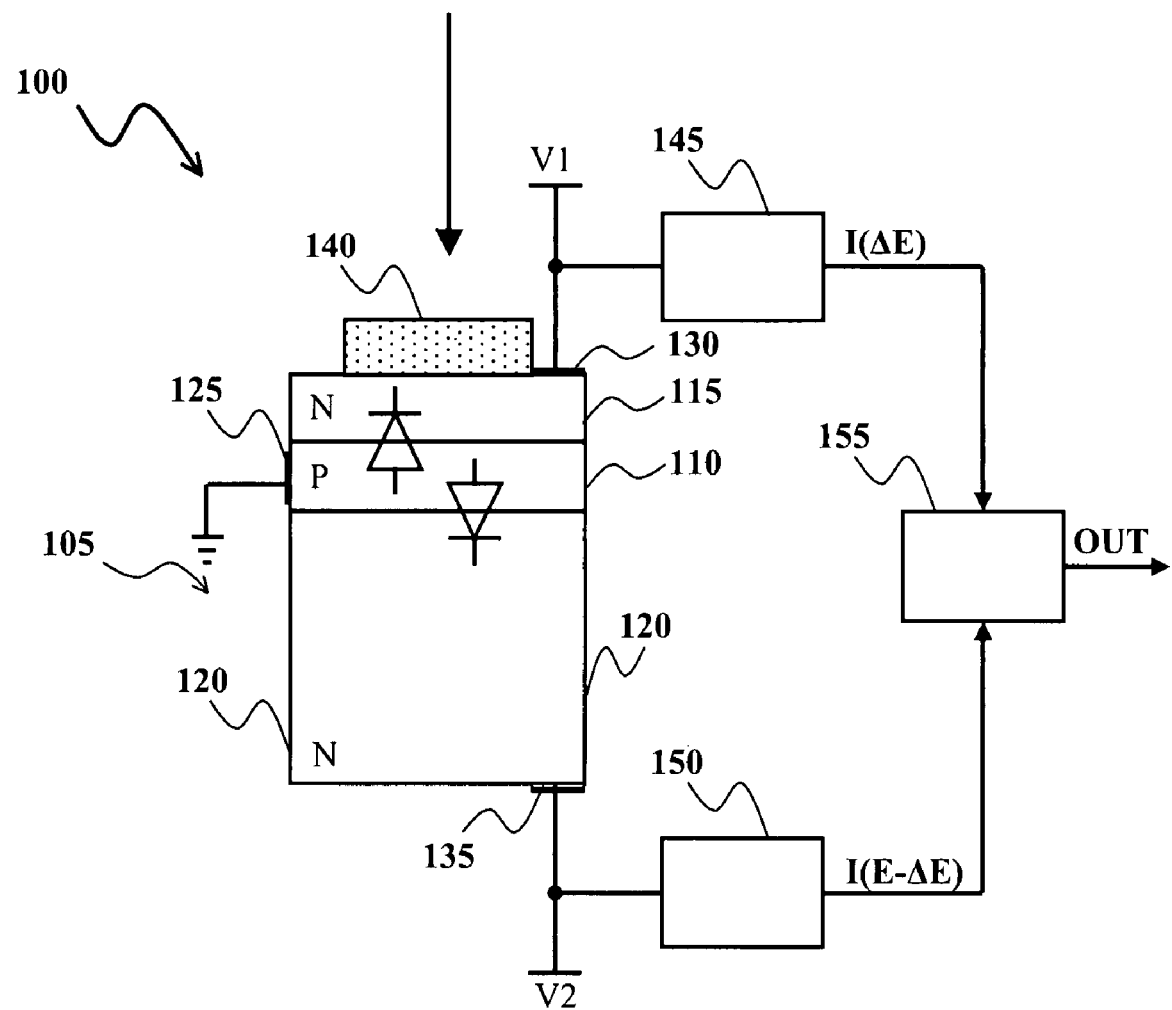
Figure 2A:
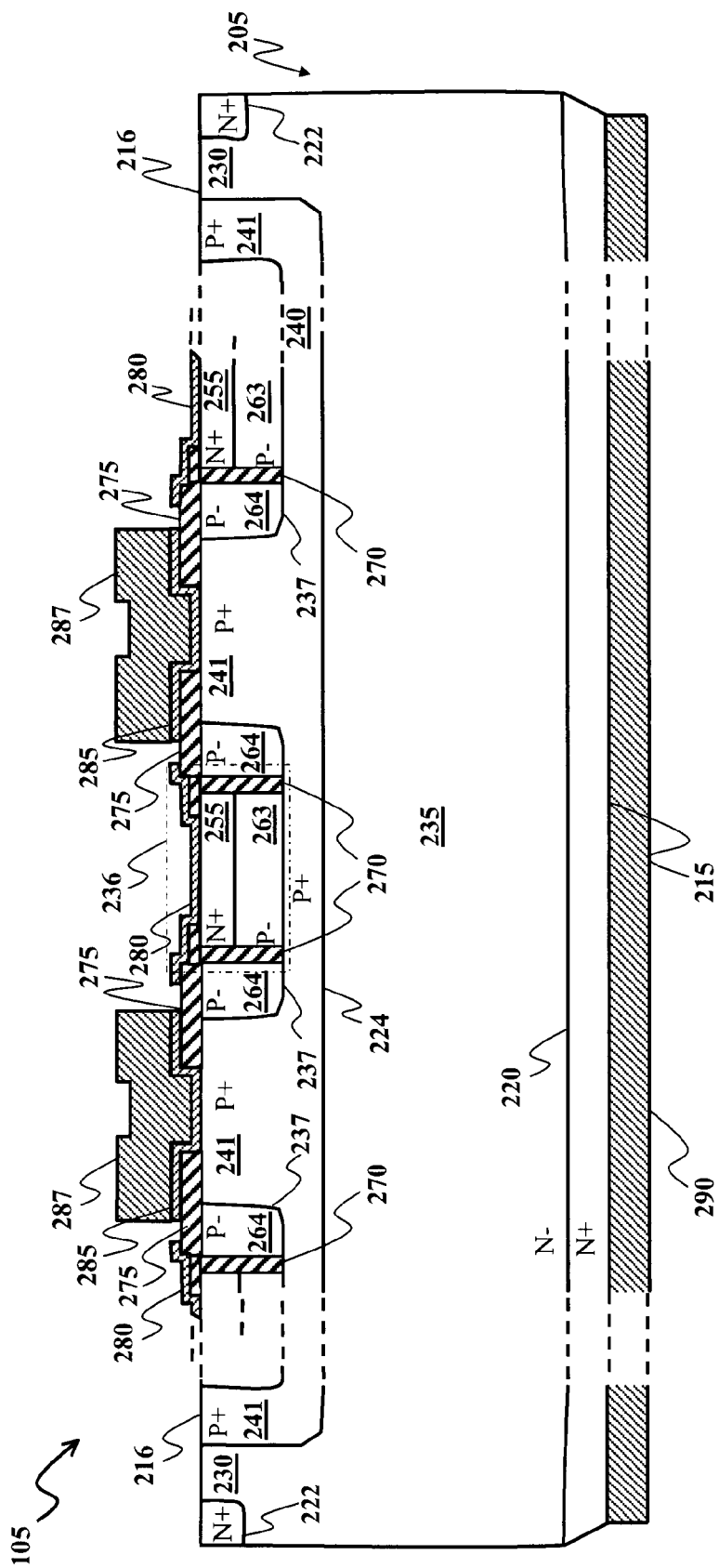
Figure 2B:
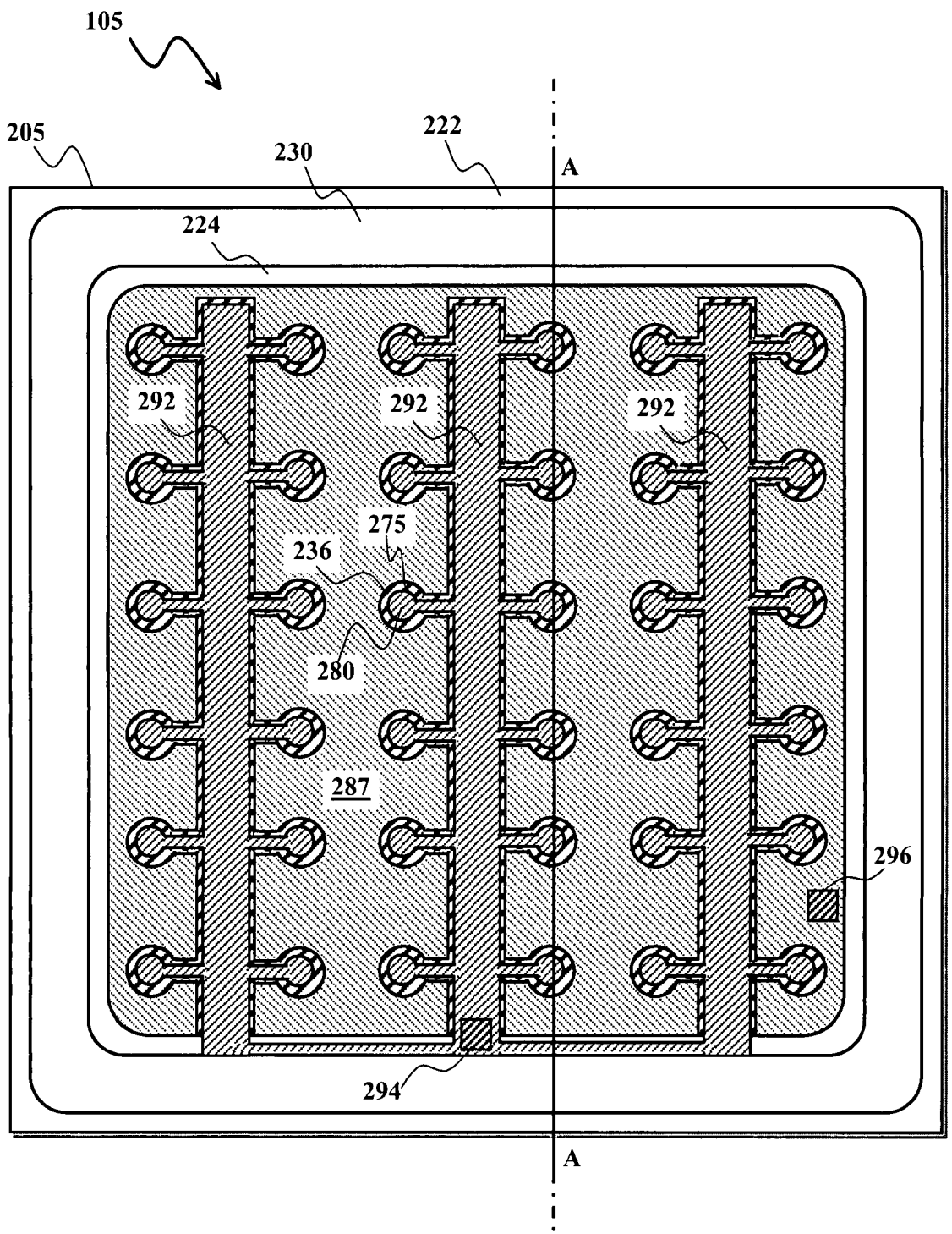

Particularly:

FIG. 1 schematically illustrates a semiconductor microdosimeter in terms of the functional blocks relevant to the understanding of an embodiment of the present invention;

FIG. 2A shows a cross-section view of a ΔE-E detector included in the microdosimeter of FIG. 1, according to an embodiment of the present invention;

FIG. 2B shows a top view of the ΔE-E detector of FIG. 2A; and

FIGS. 3A-3G are cross-section views of the ΔE-E detector of FIGS. 2A-2B at various stages of a manufacturing process according to an embodiment of the present invention.

DETAILED DESCRIPTION

With reference to the drawings, FIG. 1 schematically illustrates a semiconductor microdosimeter 100 according to an embodiment of the invention. The microdosimeter 100 includes a monolithic ΔE-E detector 105, which is integrated in a chip of semiconductor material. The type of doping ions (acceptor and donor dopants) in the various regions of the chip are indicated in the following, as usual in the art, by the letters P and N, respectively; the letters N and P may have an added minus '−' or plus '+' sign to denote light or heavy doping ions concentrations, respectively.

The ΔE-E detector 105 comprises a P-doped region 110, buried into the chip and interposed between two N-doped regions 115 and 120. Metal electrodes 125, 130 and 135 contact the regions 110, 115 and 120, respectively. In such a structure the P-doped region 110 acts as a common anode of two diodes, thus produced on the same chip, which have respective cathodes in the N-doped regions 115 and 120 (with the metal electrode 125 that defines their common anode electrode, and the metal electrodes 130 and 135 that define the corresponding cathode electrodes). The diode formed by the anode region 110 and the cathode region 115 is thinner than the diode formed by the anode region 110 and the cathode region 120; in this way, the (thin) diode 110,115 constitutes a ΔE section of the detector 105 and the (thick) diode 110,120 constitutes an E section of the detector 105.

The ΔE-E detector 105 (and more specifically an exposed surface of the cathode region 115) is covered by a layer 140 of tissue-equivalent material; for example, the tissue-equivalent layer 140 is made of a hydrogenated plastic material with an atomic composition similar to that of biological tissue, such as polyethylene.

The microdosimeter 100 also includes measuring circuits 145 and 150, which are coupled to the cathode electrode 130 and to the cathode electrode 135, respectively. The measuring circuits 145 and 150 provide respective measuring signals I(ΔE) and I(E-ΔE) corresponding to an energy absorbed by the thin diode 110,115 and by the thick diode 110,120, respectively. Moreover, the microdosimeter 100 comprises an analogic circuit 155, which receives the measuring signals I(ΔE),I(E-ΔE) and provides an output signal OUT accordingly.

In operation, two voltages V1 and V2 (with respect to a reference voltage, or ground) are applied to the cathode electrodes 130 and 135, respectively; the anode electrode 125 is instead coupled to a terminal providing the ground voltage. The voltages V1 and V2 are such that both the thin diode 110,115 and the thick diode 110,120 are reverse biased and completely depleted. Accordingly, two depletion zones of the diodes 110,115 and 110,120 are formed, so as to define the sensitive volume of the ΔE-E detector 105.

During irradiation, ionizing particles strike the tissue-equivalent layer 140 covering the ΔE-E detector 105. Any particle having an energy E so as to allow it to cross the tissue-equivalent layer 140 (represented by an arrow in the figure), reaches the depletion zones of the diodes 110,115 and 110,120 causing the formation of electron-hole pairs, i.e. it deposes a quantity of its energy E into the ΔE-E detector 105. Particularly, only a first part of the energy E (ΔE) is deposited in the thin diode 110,115, while a second part of the energy E—greater than the energy part ΔE—is deposited into the thick diode 110,120 (with this energy part that is equal to the "residual" energy, i.e. E-ΔE, when the particle stops in the ΔE-E detector 105).

The electron-hole pairs so formed move towards the electrodes 125-135 and they are collected separately by the thin diode 110,115 and by the thick diode 110,120, so as to generate two pulsed currents corresponding to the energy part ΔE and to the energy part E, respectively. These currents are amplified and detected by the measuring circuits 145 and 150, which provide the respective measuring signals I(ΔE) and I(E-ΔE).

The analogic circuit 155 can then generate the output signal OUT, according to the received measuring signals I(ΔE) and I(E-ΔE). For example, it is possible to identify the particle by measuring the signal I(ΔE)—proportional to its electrical charge—and the sum of the two signals I(ΔE) and I(E-ΔE)—proportional to its mass.

Referring now to FIG. 2A, a cross-section view of the ΔE-E detector 105 according to an embodiment of the present invention is shown in greater detail.

Particularly, the chip wherein the ΔE-E detector 105 is integrated is denoted with the reference 205; for example, the chip 205 (made of silicon) has a thickness of 400-600 µm, between a back (lower) surface 215 and a front (upper) surface 216.

An N+ contact layer 220 extends within the chip 205 from the back surface 215 for a thickness of about 1 µm. An N+ channel-stopper region 222 surrounds the whole chip on the front surface 216 for a thickness of about 1 µm; in this way, the channel-stopper region 222 defines a lateral edge surrounding an area wherein the ΔE-E detector 105 will be integrated.

A P+ region 224 extends from the front surface 216 into the chip 205 to a depth of about 2 µm. The P+ region 224 is arranged within the channel-stopper region 222 and spans most of the area surrounded by it. In this way, an N− guard region 230 of the silicon chip 205 (with a width of about 200 µm) remains between the P+ region 224 and the channel-stopper region 222; at the same time, a buried N− active region 235 (which will define a cathode of the thick diode) is interposed between the P+ region 224 and the contact layer 220 (with a thickness of about 397-597 µm in the example at issue).

The ΔE-E detector 105 includes multiple detection cells 236 (for example, from 24 to 48, such as 36). For each detection cell 236, a P− region 237 extends from the front surface 216 into the P+ region 224 to a lower depth (for example, of about 1.7 µm). In this way, the P+ region 224 is partitioned into a buried contact region 240 (with a thickness of about 0.3 µm in the example at issue) arranged between the P− regions 237 and the cathode region 235, and a sinker region 241 surrounding the P− regions 237 (connecting the buried contact region 240 to the front surface 216). An N+ active region 255 (which will define the cathode of the thin diode) in turn extends from the front surface 216 into each P− region 237 to a far lower depth (for example, of about 0.2-0.4 µm). Likewise, the P− region 237 is partitioned into a buried active region 263 (which will define the common anode of the thick and thin diodes) and an edge region 264 surrounding the cathode region 255; particularly, the anode region 263 (with a thickness of about 1.3-1.5 µm in the example at issue) is arranged between the corresponding cathode region 255 and the common buried contact region 240.

In the solution according to an embodiment of the present invention, a trench 270 (filled with insulating material, such as silicon dioxide and polysilicon) is formed in the chip 205 around each cathode region 255. The trench 270 extends from the front surface 216 to reach the buried contact region 240 (i.e., at a depth of at least 1.7 µm in the example at issue). In this way, the trench 270 completely insulates the anode region 263 from the corresponding edge region 264.

A plurality of spacers 275 of insulating material (e.g., $SiO_2$), one for each detection cell 236, is formed over the front surface 216. Particularly, each insulating spacer 275 lies over a part of the surrounding sinker region 241, the trench 270, the edge region 264, and an outer portion of the cathode region 255 of the respective detection cell 236; in this way, a sensitive area of the detection cell 236 is defined over the cathode region 255 within the insulating spacer 275, while multiple contact windows remain opened over the sinker region 241.

A metal strip 280 (for example, of titanium) lies in contact with this sensitive area of the detection cell 236 (partially covering the surrounding insulating spacer 275), so as to define an electrical contact of the cathode region 255. A further metal strip 285 (for example, of titanium) lies in contact with the sinker region 241 through the respective contact windows (partially covering the adjacent insulating spacers 275); a metal strip 287 (for example, of aluminum) is formed over the metal strip 285, so as to define an electrical contact of the anode regions 263 (through the buried contact region 240 and the sinker region 241). A metal layer 290 (for example, of aluminum) is instead formed over the whole back surface 215, so as to define an electrical contact of the cathode region 235 (through the contact region 220).

In the above-described structure of the ΔE-E detector 105, each detection cell 236 consists of two diodes having a vertical arrangement and a common anode buried into the chip. Particularly, for each detection cell 236 the thin diode is formed by the P− region 263 (anode) and the N+ region 255 (cathode), whereas the thick diode is formed by the P+ region 240 (anode) and the N− region 235 (cathode); the common anode electrode is formed by the metal strips 285,287, whereas the cathode electrodes for the thin diode and for the thick diode are formed by the metal strip 280 and the metal layer 290, respectively.

In this way, the depletion zone of the thin diode mainly extends into the (more lightly doped) anode region 263 and the depletion zone of the thick diode mainly extends into the (more lightly doped) cathode region 235; the two depleted regions are then clearly separated by the heavily doped (anode) buried contact region 240. Therefore, the electron-hole pairs generated in the two diodes by the energy that is lost by any ionizing particle are collected in a completely distinct way. This strongly reduces the field-funneling effect. Moreover, the sinker region 241 surrounding each detection cell 236 prevents a capacitive coupling with adjacent detection cells 236, allowing the ΔE-E detector 105 to show a limited capacitance.

In the solution according to an embodiment of the present invention, the addition of the trenches 270 strongly improves the performance of the ΔE-E detector 105. Indeed, in each detection cell 236 the corresponding trench 270 limits a corresponding sensitive volume of the thin diode to the anode region 263 (surrounded and insulated by the trench 270); in this way, the edge region 264 does not contribute to collect hole-electron pairs. Then, the sensitive volume may be maintained to the desired value (i.e., comparable to the biological cell size).

Moving now to FIG. 2B, a top view of the ΔE-E detector 105 described-above is illustrated (the elements corresponding to those depicted in FIG. 2A are denoted with the same references and their description is omitted for the sake of simplicity).

In an embodiment of the invention, each detection cell 236 has a circular section (since this shape better emulates the behavior of a corresponding biological cell). Typically, the detection cells 236 are arranged in a matrix (for example, six rows and six columns). The cross section of the ΔE-E detector 105 illustrated in FIG. 2A is taken at a plane AA along a column of the detection cells 236. The number of detection cells 236 is chosen in such a way to have a sensitive area of the ΔE-E detector 105 (at the front surface thereof) sufficiently large to ensure good detection efficiency. A limit to the widening of the ΔE-E detector 105 is due to the capacitance shown by all the detection cells 236 connected in parallel, because a small capacitance permits to keep low the electronic noise.

The anode electrode (with only the upper metal strip 287 visible in the figure) covers most of the P+ region 224 (only leaving an external edge thereof exposed); for example, the metal strip 287 has a square shape surrounding the matrix of the detection cells 236. On the other hand, the cathode electrode (formed by the metal strip 280) has a circular portion for each detection cell 236. A strip 292 connects the circular portions of each pair of adjacent columns of the matrix (through corresponding interconnection segments); the strips 292 are in turn connected together in an area overlying the external edge of the P+ region 224, where a bonding pad 294 is provided for applying the desired biasing voltage. Similarly, a further bonding pad 296 is provided for applying a biasing voltage to the metal strip 287. The metal strip 280 and the metal strip 287 are separated by the insulating spacer 275 (with a partially cut-away circular crown shape around each detection cell 236).

The guard portion 230 separates the P+ region 224 from the channel-stopper region 222, which in turn surrounds the whole ΔE-E detector 105 as a square frame; this additional feature further improves the electrical characteristics of the ΔE-E detector 105 (and especially its noise immunity).

The main stages of an exemplary process for the fabrication of the ΔE-E detector according to an embodiment of the present invention are described hereinafter with reference to FIGS. 3A-3G (the elements corresponding to those depicted in FIGS. 2A and 2B are denoted with the same reference numerals and their description is omitted for the sake of simplicity).

Referring to FIG. 3A, the process starts from a silicon wafer 305 lightly doped by N type dopants and, for example, with a crystallographic orientation {1.0.0}. The wafer 305 is obtained with a floating zone (FZ) process (by establishing a melt zone between a seed material and a feed material through the application of localized heating), so as to obtain a substantially pure material. In this way, it is possible to have a very high resistivity (e.g., of about 4.000-6.000 Ω·cm).

The whole surface of the wafer 305 is then covered by a layer of silicon dioxide 310 (as shown for the back surface 215 and for the front surface 216 in the figure); for example, this result is achieved by oxidation in an oxidizing atmosphere at high temperature. The oxide layer 310 on the front surface 216 is then selectively etched with conventional photolithographic techniques (by means of a resist mask suitably shaped, not shown in the figure), so as to open windows corresponding to the sinker region 241. An implant of P type dopants (for example, boron ions) is now performed through the portion of the front surface 216 uncovered by the above-mentioned etching. The implant may be executed in two steps, which differ for the implant doses and energies (with a total dose of about $1 \cdot 10^{15}$ cm$^{-2}$ and energies of about 80 keV to 450 keV). Successively, a thermal diffusion in oxidizing atmosphere is performed, so as to obtain the sinker region 241 with a peak of dopant concentration (at a depth of 0.5-1.5 μm) of about 1.1019 cm$^{-3}$.

As illustrated in FIG. 3B, the oxide layer 310 is again selectively etched with conventional photolithographic techniques so as to open a (larger) window corresponding to the P+ region 224. An implant of P type dopants (for example, boron ions) is now performed through the portion of the front surface 216 uncovered by the above-mentioned etching. The implant has a very high energy (e.g., 1 MeV) and with a dose of about $1 \cdot 10^{14}$ cm$^{-2}$; this allows obtaining the buried contact region 240. The P− regions 237, within the sinker region 241, are then formed by diffusion of the P doping ions from the buried contact region 240 towards the front surface 216. Accordingly, a retrograde implant of P doping ions is obtained having a peak dopant concentration of about $1 \cdot 10^{18}$ cm$^{-3}$ in the buried contact region 240. The (remaining) oxide layer 310 is then etched from both the back surface 215 and the front surface 216.

Figure 3C:
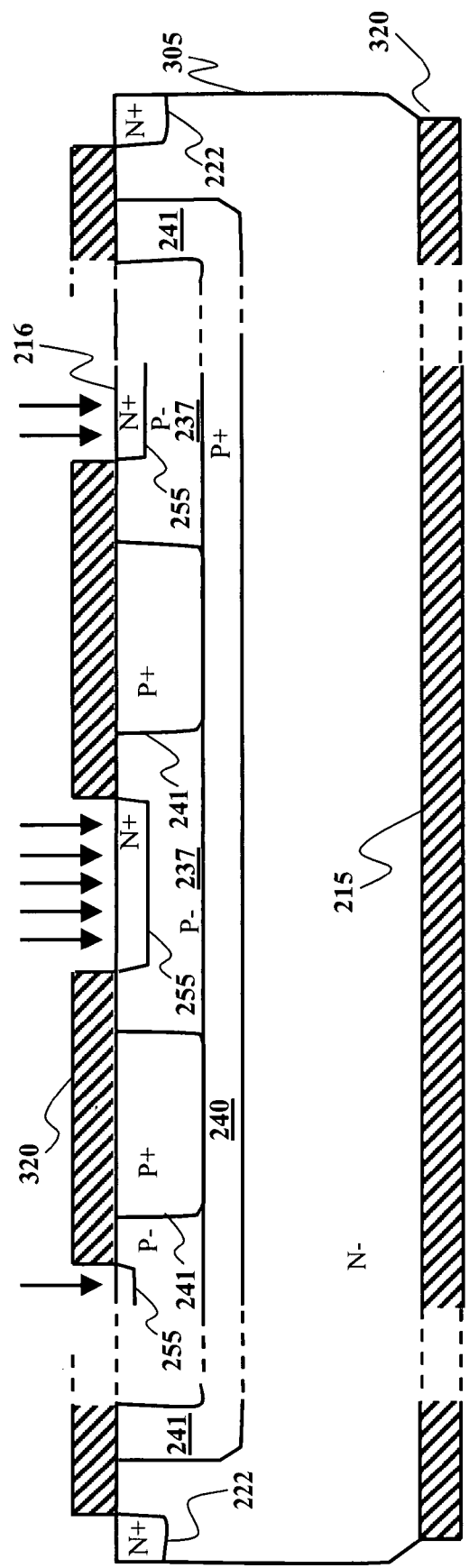

Likewise, as illustrated in FIG. 3C, the whole surface of the wafer 305 is again covered by another layer of silicon dioxide 320, which is then selectively etched with conventional photolithographic techniques so as to open windows corresponding to the channel-stopper region 222 and to the cathode region 255. An implant of N type dopants (for example, arsenic ions) is now performed through the portion of the front surface 216 uncovered by the above-mentioned etching; for example, the implant is carried out with a dose of about $5 \cdot 10^{14}$ cm$^{-2}$ and an energy of about 60 keV.|

Then, as illustrated in FIG. 3D, a hard-mask 327 is formed on top of the silicon wafer 305, thereby also covering the oxide layer 320; the hard mask 327 is realized by deposing a layer of a different dielectric, such as nitride or P-vapox. Both the hard-mask 327 and the dioxide layer 320 are selectively etched with conventional photolithographic techniques so as to open windows corresponding to the trenches 270. A dry etching of the wafer 305 is then carried out through the portion of the front surface 216 uncovered by the above-mentioned etching. The trenches 270, having a circular crown section (for example, with a width of about 1 μm) are obtained, extending roughly orthogonally down to the buried contact region 240. The process continues by growing a dioxide layer 332 on the walls of the trenches 270. The whole wafer 305 is now covered by a polysilicon layer 335 (through deposition), in such a way to completely fill the trenches 270.

Successively, as shown in FIG. 3E, the polysilicon layer 335 and the hard-mask 327 are completely removed (without impairing the dioxide layer 320). The dioxide layer 320 is now removed from the back surface 215; an implantation of Phosphorus ions with dose of, for example, $1 \cdot 10^{16}$ cm$^{-2}$ and energy of, for example, 80 keV is performed so as to realize the contact layer 220 at the back surface 215.

Referring to FIG. 3F, a diffusion in oxidizing atmosphere is performed, so as to form a further dioxide layer 340 over the front and back surfaces 216 and 215; this step is followed by a segregation annealing process.

As depicted in FIG. 3G, the oxide layers 320 and 340 are selectively etched with conventional photolithographic techniques so as to open contact windows for the sinker region 241 and the cathode regions 255. A first thin metal layer 350 (for example, of titanium) and a second thick metal layer 355 (for example, of aluminum) are deposited over the whole front surface 216, so as to fill the contact windows defined by the above-mentioned etching. The metal layers 350 and 355 are then selectively etched with conventional photolithographic techniques so as to shape them according to the desired electrical contacts of the sinker region 241 and of the cathode regions 255.

A further selective etching is exploited for removing only the excess of the aluminum layer 355 over the portion of the front surface 216 intended to be the sensitive area of the ΔE-E detector (i.e., over the cathode regions 255). Therefore, as shown in FIG. 2A, the metal strips 285, 287 in contact with the sinker region 241 and the metal strip 280 in contact with each cathode region 255 are obtained. The process then ends with the deposition of the metal layer 290 (for example, aluminum) over the back surface 215.

Naturally, in order to satisfy local and specific requirements, a person skilled in the art may apply to the solution described above many modifications and alterations. Particularly, although the present invention has been described with a certain degree of particularity with reference to embodiment(s) thereof, it should be understood that various omissions, substitutions and changes in the form and details as well as other embodiments are possible; moreover, it is expressly intended that specific elements and/or method steps described in connection with any disclosed embodiment of the invention may be incorporated in any other embodiment as a general matter of design choice.

For example, similar considerations apply if the ΔE-E detector has an equivalent structure. For example, the wafer can be made of a different semiconductor material and, particularly, can be different from a floating-zone silicon wafer. Likewise, the regions may have different size, thickness and/or dopant concentrations, or the regions of the N-type may be replaced by regions of the P-type, and vice-versa; furthermore, alternative materials can be utilized for fabricating the ΔE-E detector, such as different dopants, metals, or dielectrics.

Likewise, the ΔE-E detector may be realized with an equivalent structure of its (thin and/or thick) diodes.

In addition, nothing prevents extending the insulation trench of each detection cell to a different depth (for example, more deeply into the buried contact region); however, an implementation wherein the depth of the insulation trench is slightly lower than the one of the anode region is contemplated (even if it might be less advantageous).

Similar considerations apply if each trench has a different structure, shape and/or size; more generally, whatever equivalent insulation means may be used to implement the proposed solution.

Although in the present description reference has been made to detection cells with circular shape, this is not to be interpreted in a limitative manner (the solution may be implemented with any other section of the detection cells, such as a square).

Likewise, alternative layouts of the detection cells are feasible (for example, with a different number of detection cells, a different arrangement, and the like); in any case, an implementation of the ΔE-E detector with a single detection cell is within the scope of the invention.

It is also possible to use a channel-stopper with a different shape or structure; in any case, this feature is not strictly necessary and it may be omitted in some implementations of the ΔE-E detector.

Similar considerations apply if the proposed ΔE-E detector is used in different microdosimeters (for example, without any tissue-equivalent layer for microelectronics applications), or more generally in any other system.

At the end, the fabrication process of the ΔE-E detector can comprise additional stages or the stages can be executed in a different order and/or exploiting alternative techniques; particularly, the masks used during the process can be different in number and in type.

It should be readily apparent that the design of the ΔE-E detector may be created in a programming language; moreover, if the designer does not fabricate chips or masks, the design may be transmitted by physical means to others. In any case, the resulting integrated circuit may be distributed by its manufacturer in raw wafer form, as a bare die, or in packages form. Moreover, the ΔE-E detector may be integrated with other circuits on the same chip, and it may be mounted in intermediate products (such as electronic boards), or in complex systems.

From the foregoing it will be appreciated that, although specific embodiments of the invention have been described herein for purposes of illustration, various modifications may be made without deviating from the spirit and scope of the invention.

What is claimed is:

1. A radiation detector of the ΔE-E type integrated in a chip of semiconductor material with a front surface and a back surface opposite the front surface, the detector having at least one detection cell arranged on the front surface for receiving a radiation to be evaluated, wherein the detector includes:
    a first region of a first type of conductivity extending into the chip from the front surface to a first depth;
    a second region of a second type of conductivity extending into the chip from the back surface to a second depth so as to reach the first region; and
    for each detection cell a third region of the second type of conductivity extending into the first region from the front surface to a third depth lesser than the first depth and the second depth, a thin sensitive volume for absorbing energy from the radiation being defined by a junction between the first region and each third region, and a thick sensitive volume for absorbing further energy from the radiation being defined by a further junction between the first region and the second region;
    wherein for each detection cell the detector further includes insulation means arranged around the third region and extending from the front surface into the first region to an insulation depth comprised between the first depth and the third depth.

2. A process for integrating a radiation detector of the ΔE-E type in a chip of semiconductor material with a front surface and a back surface opposite the front surface, the detector having at least one detection cell arranged on the front surface for receiving a radiation to be evaluated, wherein the process includes the steps of:

forming a first region of a first type of conductivity extending into the chip from the front surface to a first depth;

forming a second region of a second type of conductivity extending into the chip from the back surface to a second depth so as to reach the first region; and for each detection cell forming a third region of the second type of conductivity extending into the first region from the front surface to a third depth lesser than the first depth and the second depth, a thin sensitive volume for absorbing energy from the radiation being defined by a junction between the first region and each third region, and a thick sensitive volume for absorbing further energy from the radiation being defined by a further junction between the first region and the second region; and further comprising for each detection cell further forming insulation means arranged around the third region and extending from the front surface into the first region to an insulation depth comprised between the first depth and the third depth.

3. A semiconductor device, comprising:

a substrate having first and second opposite surfaces;

a first region of a first conductivity type disposed in the substrate adjacent to the first surface and having a side and a first thickness;

a second region of a second conductivity type disposed in the substrate between the first region and the second surface and contiguous with the first region, and having a side and a second thickness;

a third region of the first conductivity type disposed in the substrate between the second region and the second surface and having a third thickness that is greater than the first thickness;

a fourth region of the second conductivity type disposed between and contiguous with the second and third regions; and an insulator region disposed in the substrate contiguous with the sides of the first and second regions.

4. A semiconductor device, comprising:

a substrate having first and second opposite surfaces;

a first region of a first conductivity type disposed in the substrate adjacent to the first surface and having a side and a first thickness;

a second region of a second conductivity type disposed in the substrate between the first region and the second surface and contiguous with the first region, and having a side and a second thickness;

a third region of the first conductivity type disposed in the substrate between the second region and the second surface and having a third thickness that is greater than the first thickness; and an insulator region disposed in the substrate contiguous with the sides of the first and second regions;

wherein the first region is contiguous with the first surface;

wherein the second region is contiguous with the first surface;

wherein the third region is contiguous with the second surface; and further comprising:

a first conductive contact contiguous with the first region at the first surface;

a second conductive contact contiguous with the second region at the first surface; and a third conductive contact contiguous with the third region at the second surface.

5. A semiconductor device, comprising:

a substrate having first and second opposite surfaces;

a first region of a first conductivity type disposed in the substrate adjacent to the first surface and having a side and a first thickness;

a second region of a second conductivity type disposed in the substrate between the first region and the second surface and contiguous with the first region, and having a side and a second thickness;

a third region of the first conductivity type disposed in the substrate between the second region and the second surface and having a third thickness that is greater than the first thickness;

a fourth region of the first conductivity type disposed at the first surface of the substrate around the first region; and an insulator region disposed in the substrate contiguous with the sides of the first and second regions.

6. The detector according to claim 1, wherein the first region includes an active region forming the junction and a contact region contacting the active region from the front surface, and wherein the second region includes a further active region forming the further junction and a further contact region contacting the further active region from the back surface, the active region and the further active region having a low doping concentration and the contact region and the further contact region having a high doping concentration higher than the low doping concentration.

7. The detector according to claim 1, wherein for each detection cell the insulating means includes a trench formed in the chip, the trench being filled with an insulating material.

8. The detector according to claim 1, wherein each third region has a circular section.

9. The detector according to claim 1, wherein the at least one detection cell consists of a plurality of detection cells electrically connected together.

10. The detector according to claim 1, further including a channel-stopper region with the second type of conductivity arranged around the first region and extending from the front surface into the chip.

11. The detector according to claim 6, wherein each active region is included in a fourth region extending into the chip from the front surface to a fourth depth comprised between the first depth and the third depth, each third region extending into the corresponding forth region, and wherein the insulation depth is substantially equal to the fourth depth, the insulation means insulating the active region from a remaining part of the fourth region.

12. The detector according to claim 11, wherein the contact region includes a buried contact region interposed between the further active region and each active region and a sinker region extending from the front surface to the buried contact region.

13. The semiconductor device of claim 3 wherein:

the first conductivity type comprises a donor conductivity type; and the second conductivity type comprises an acceptor conductivity type.

14. The semiconductor device of claim 3 wherein:

the first and second regions compose a first diode; and the second and third regions compose a second diode.

15. The semiconductor device of claim 3 wherein:

the first and second regions respectively compose a cathode and an anode of a first diode; and the second and third regions respectively compose an anode and a cathode of a second diode.

16. The semiconductor device of claim 3 wherein the insulator region is contiguous with the entire side of the first region and the entire side of the second region.

17. The semiconductor device of claim 3 wherein the insulator region is fully contiguous with the side of the first region and partially contiguous with the side of the second region.

18. The semiconductor device of claim 3 wherein the third region is contiguous with the second region.

19. The semiconductor device of claim 3 wherein the second thickness is greater than the first thickness and smaller than the third thickness.

* * * * *